(12) United States Patent
Abe et al.

(10) Patent No.: US 10,563,842 B2
(45) Date of Patent: Feb. 18, 2020

(54) LIGHT-EMITTING DEVICE

(71) Applicant: Panasonic Intellectual Property Management Co., Ltd., Osaka (JP)

(72) Inventors: Takeshi Abe, Osaka (JP); Shozo Oshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/779,348

(22) PCT Filed: Nov. 21, 2016

(86) PCT No.: PCT/JP2016/004926
§ 371 (c)(1),
(2) Date: May 25, 2018

(87) PCT Pub. No.: WO2017/119022
PCT Pub. Date: Jul. 13, 2017

(65) Prior Publication Data
US 2018/0306410 A1    Oct. 25, 2018

(30) Foreign Application Priority Data
Jan. 7, 2016 (JP) .................. 2016-001494

(51) Int. Cl.
*F21V 9/32* (2018.01)
*G02B 6/00* (2006.01)
*H01S 5/022* (2006.01)
*F21V 9/38* (2018.01)
*F21V 8/00* (2006.01)

(52) U.S. Cl.
CPC .................. *F21V 9/32* (2018.02); *F21V 9/38* (2018.02); *G02B 6/00* (2013.01); *G02B 6/0005* (2013.01); *H01S 5/022* (2013.01)

(58) Field of Classification Search
None
See application file for complete search history.

(56) References Cited

U.S. PATENT DOCUMENTS

2002/0043926 A1    4/2002  Takahashi et al.
2008/0169752 A1*   7/2008  Hattori .................. H01L 33/507
                                                         313/503
(Continued)

FOREIGN PATENT DOCUMENTS

CN    102606962 A    7/2012
JP    2002-076434 A  3/2002
(Continued)

OTHER PUBLICATIONS

International Search Report issued in Application No. PCT/JP2016/004926 dated Feb. 21, 2017, with English translation.
(Continued)

*Primary Examiner* — Elmito Breval
(74) *Attorney, Agent, or Firm* — McDermott Will & Emery LLP

(57) ABSTRACT

A light-emitting device includes a radiation source that radiates laser light as first primary light, and a first wavelength converter, and emits output light. The first wavelength converter has an incidence face on which the first primary light is incident, and an emission face through which the output light emits. A normal to the incidence face and a normal to the emission face are mutually different. A first phosphor included in the first wavelength converter is a single crystal phosphor.

20 Claims, 2 Drawing Sheets

(56) References Cited

U.S. PATENT DOCUMENTS

| | | |
|---|---|---|
| 2010/0149815 A1 | 6/2010 | Erchak |
| 2010/0295438 A1 | 11/2010 | Ott et al. |
| 2011/0128471 A1 | 6/2011 | Suckling et al. |
| 2012/0212931 A1 | 8/2012 | Kinoshita et al. |
| 2013/0215598 A1 | 8/2013 | Guzan et al. |
| 2014/0092620 A1* | 4/2014 | Tissot ............... G02B 6/0003 362/553 |
| 2014/0177201 A1 | 6/2014 | Sheu |
| 2015/0083967 A1 | 3/2015 | Watanabe et al. |
| 2015/0171284 A1 | 6/2015 | Bechtel et al. |
| 2016/0091171 A1* | 3/2016 | Okada ................... F21V 3/061 372/44.01 |
| 2018/0044588 A1 | 2/2018 | Watanabe |

FOREIGN PATENT DOCUMENTS

| | | |
|---|---|---|
| JP | 2006-073202 A | 3/2006 |
| JP | 2014-210684 A | 11/2014 |
| WO | 2013/161683 A1 | 10/2013 |
| WO | 2015/169270 A2 | 11/2015 |

OTHER PUBLICATIONS

Extended European Search Report issued in Application No. 16883528.8 dated Dec. 19, 2018.
Office Action issued in corresponding Chinese Application No. 201680069701.8, dated Aug. 26, 2019.
English translation of search report issued in corresponding Chinese Application No. 201680069701.8, dated Aug. 26, 2019.

* cited by examiner

LIGHT-EMITTING DEVICE

RELATED APPLICATIONS

This application is a national stage of International Application No. PCT/JP2016/004926, filed Nov. 21, 2016, which claims the benefit of Japanese Application No. 2016-001494, filed on Jan. 7, 2016, the disclosures of which are incorporated in their entirety by reference herein.

TECHNICAL FIELD

The present invention relates to a light-emitting device.

BACKGROUND ART

In recent years, light-emitting devices, each being a combination of a solid-state light-emitting element that emits laser light and a wavelength converter containing phosphors, have been proposed. Such light-emitting devices include a light-emitting device by which the wavelength or spectrum of emitted light is changed to a desired wavelength as a result of the combination of a solid-state light-emitting element and phosphors in accordance with the application.

The problem, however, is that when phosphors are excited with laser light having high output, temperature quenching in which luminous efficiency decreases with an increase in the temperature of the phosphors is significant, and this decreases the output of the light-emitting device. To address the problem described above, Patent Literature 1 (PTL 1) has proposed a light-emitting device that utilizes a single crystal phosphor causing a small degree of temperature quenching.

CITATION LIST

Patent Literature

PTL 1: International Publication WO/2013/161683

SUMMARY OF THE INVENTION

Technical Problem

When using, as excitation light, laser light having a high directivity, however, the problem is that unevenness in the color of output light easily occurs. For example, when using a light-emitting device of a type under which a solid-state light-emitting element is mounted on a bottom face of a recessed portion of the package, an amount of phosphors above the solid-state light-emitting element tends to be less than an amount of phosphors diagonally above the solid-state light-emitting element. This renders the color of laser light to be darker in the center (above the solid-state light-emitting element) of the emission face of output light. Accordingly, the light-emitting color of the phosphors gets darker in the surrounding portion (diagonally above the solid-state light-emitting element), and this causes unevenness in the color of the output light. For example, when using a light-emitting device that is a combination of a solid-state light-emitting element that emits laser light of bluish color and YAG phosphors that absorb the laser light and perform wavelength conversion into yellowish light, the center of output light has darker blue and the surrounding portion has darker yellow. This problem is particularly significant in a light-emitting device that utilizes a single crystal phosphor having high transmissivity for laser light.

The present invention is conceived to overcome the above-described problem, and has an object to provide a light-emitting device that produces less unevenness in the color of output light.

Solution to Problem

In order to achieve the above-described object, one aspect of the light-emitting device according to the present invention is a light-emitting device that emits output light and includes: a radiation source that radiates laser light as first primary light; and a first wavelength converter. The first wavelength converter includes at least a first phosphor. The first wavelength converter scatters at least part of the first primary light and converts into second primary light that propagates in a direction different from an optical-axis direction of the first primary light. The first phosphor included in the first wavelength converter absorbs at least part of the first primary light and the second primary light and converts into secondary light. The secondary light has more long-wavelength components than a wavelength component of at least one of the first primary light or the second primary light, and the output light includes the second primary light and the secondary light. The first wavelength converter has an incidence face on which the first primary light is incident and an emission face through which the output light emits, and a normal to the incidence face and a normal to the emission face are mutually different. The first phosphor is a single crystal phosphor.

Advantageous Effect of Invention

According to one aspect of the present invention, it is possible to provide a light-emitting device that produces less unevenness in the color of output light.

DESCRIPTION OF EXEMPLARY EMBODIMENTS

Hereinafter, the embodiments of the present invention will be described with reference to the drawings. Note that the subsequently-described embodiments show specific examples of the present invention. Accordingly, the numerical values, shapes, materials, structural components, the arrangement and connection of the structural components, etc. shown in the following embodiments are mere examples, and are not intended to limit the scope of the present invention. Therefore, among the structural components in the following embodiments, components not recited in any one of the independent claims which indicate the broadest concepts of the present invention are described as arbitrary structural components.

Note that the respective figures are schematic diagrams and are not necessarily precise illustrations. In addition, in the respective figures, substantially identical components are assigned the same reference signs, and overlapping description is omitted or simplified.

Embodiment 1

First, the configuration of light-emitting device 21 according to Embodiment 1 will be described with reference to FIG. 1.

Figure 1:
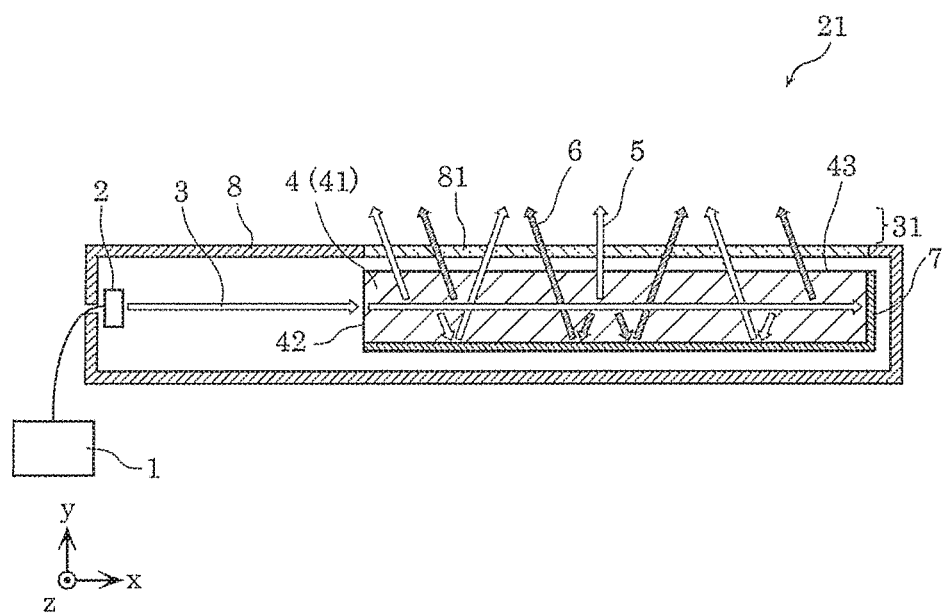
FIG. 1 is a schematic view of a light-emitting device according to Embodiment 1.

As illustrated in FIG. 1, light-emitting device 21 according to Embodiment 1 is a device that includes radiation source 2 which emits laser light as 1-1 light 3, and first wavelength converter 4, and emits output light 31. Stated differently, 1-1 light 3 is first primary light.

First wavelength converter 4 scatters at least part of 1-1 light 3 and converts into 1-2 light 5 that propagates in a direction different from the optical-axis direction of 1-1 light 3. Stated differently, 1-2 light 5 is second primary light. In addition, first wavelength converter 4 absorbs at least part of 1-1 light 3 and 1-2 light 5 and converts into secondary light 6.

In Embodiment 1, light-emitting device 21 has a rectangular shape, radiation source 2 is located in the vicinity of one face of the rectangular shape, and a direction approximately vertical to the face on which radiation source 2 is located corresponds to the optical-axis direction of 1-1 light 3. Radiation source 2 receives power necessary for emitting 1-1 light 3, for example, by being electrically connected to external power source 1. Light-emitting device 21 defines the optical-axis direction of 1-1 light 3 to be an x-axis. Moreover, directions mutually orthogonal in a plane orthogonal to the x-axis are defined to be a y-axis and a z-axis, respectively. In Embodiment 1, the size of light-emitting device 21 is, for example, within a size defined by 100 mm in an x-axis direction, 30 mm in a y-axis direction, and 100 mm in a z-axis direction.

The following describes in detail, with reference to FIG. 1, the detailed configuration of light-emitting device 21.

[Radiation Source]

Radiation source 2 emits laser light as 1-1 light 3. A laser diode such as a surface emitting laser diode, for example, can be used as such radiation source 2. Radiation source 2 is connected to external power source 1.

Radiation source 2 is, for example, a solid-state light-emitting element. Such a configuration allows the size of radiation source 2 to be smaller and this enables reduction in the size of light-emitting device 21.

Radiation source 2 may radiate bluish light having an emission spectrum indicating a maximum peak intensity in the wavelength range of, for example, at least 420 nm and at most 480 nm or at least 440 nm and at most 470 nm. By the fact that 1-1 light 3 has a maximum peak intensity in the wavelength rage as described above, 1-1 light 3 becomes visually recognizable blue light and 1-2 light 5 which is a scattered component of 1-1 light 3 also becomes visually recognizable blue light. 1-2 light 5 can be therefore used, without waste, not only as excitation light that excites first phosphors 41, but also as output light 31 of light-emitting device 21.

Moreover, radiation source 2 may radiate, as 1-1 light 3, ultraviolet light having an emission spectrum indicating a maximum peak intensity in the wavelength range of, for example, at least 200 nm and at most 380 nm or at least 360 nm and at most 380 nm. Furthermore, radiation source 2 may radiate, as 1-1 light 3, purplish light having an emission spectrum indicating a maximum peak intensity in the wavelength range of, for example, at least 200 nm and at most 380 nm or at least 395 nm and at most 415 nm. When 1-1 light 3 has a maximum peak intensity in the wavelength range of the ultraviolet light or purplish light, a blue phosphor can be selected as first phosphor 41. By using a blue phosphor as first phosphor 41, blue light that has a broad spectrum of light emitted by first phosphor 41 can be used as part of output light 31. In general, the spectrum of light emitted from a phosphor has a broader spectrum width (FWHM: Full Width at Half Maximum) than laser light. With the configuration as described above, it is possible to achieve output light 31 having high color rendering properties.

[First Wavelength Converter]

First wavelength converter 4 has a flat plate shape and is disposed in such a manner that the y-axis direction of light-emitting device 21 is approximately parallel to the thickness direction of first wavelength converter 4. Such a structure allows first wavelength converter 4 to have a shape identical to the shape of a wavelength converter practically qualified over a long manufacturing history. It is therefore possible to use readily procurable and high-quality first wavelength converter 4, and to provide light-emitting device 21 that emits highly reliable output light 31.

First wavelength converter 4 is provided in a position where 1-1 light 3 is irradiated from radiation source 2.

First wavelength converter 4 includes first phosphors 41. In Embodiment 1, first wavelength converter 4 includes only first phosphors 41, and first phosphor 41 is composed of one single crystal phosphor having a garnet crystal structure.

First wavelength converter 4 has incidence face 42 on which 1-1 light 3 is incident and emission face 43 through which output light 31 emits. A normal to incidence face 42 and a normal to emission face 43 are mutually different. For example, the normal to incidence face 42 and the normal to emission face 43 may be approximately vertical to each other.

First wavelength converter 4 scatters at least part of 1-1 light 3 and propagates 1-2 light 5 which is a scattered component of 1-1 light 3. For example, at least part of 1-1 light 3 may be scattered by defects in an interface portion between incidence face 42 and emission face 43 or by at least one portion where refractive indices are different in first wavelength converter 4. Wavelength converter 4 is configured so that 1-2 light 5 emits through emission face 43.

In addition, first wavelength converter 4 absorbs at least part of 1-1 light 3 and 1-2 light 5 and converts into secondary light 6. Wavelength converter 4 is configured so that secondary light 6 emits through emission face 43.

[First Phosphor]

First phosphor 41 is included in first wavelength converter 4, absorbs at least part of 1-1 light 3 and 1-2 light 5, as excitation light, and emits, as secondary light 6, a phosphor containing more long-wavelength components than a wavelength component of at least one of 1-1 light 3 or 1-2 light 5.

In Embodiment 1, first phosphor 41 has a garnet structure. With such a structure, first phosphor 41 becomes chemically stable, and it is therefore possible to provide a light-emitting device with good reliability.

A garnet structure is expressed by a general formula $A'_3B'_2(C'X)_3$. It should be noted that A', B' and C' denote metallic elements that may possibly have a garnet structure whereas X denotes a nonmetal element that may possibly have a garnet structure.

Here, the metal element A' is, for example, at least one element selected from alkali metals, alkaline earth metals, magnesium, rare earths, and transition metals. More specifically, the metal element A' is at least one element selected, for example, from Na, K, Rb, Cs, Mg, Ca, Sr, Ba, Y, Ln, and Mn (Ln represents lanthanoid having atomic numbers from 57 to 71).

The metal element B' is, for example, at least one element selected from Mg, rare earths, transition metals, alkaline earth metals, magnesium, and carbon-family elements. More specifically, the metal element B' is, at least one element selected, for example, from Mg, Sc, Y, Lu, Ti, Zr, Hf, V, Cr, Nb, Fe, Co, Ni, Cu, Zn, Al, Ga, In, and Sn.

The metal element C' is, for example, at least one element selected from alkali metals, transition metals, alkaline earth metals, magnesium, carbon-family elements, and nitrogen-family elements. More specifically, the metal element C' is at least one element selected, for example, from Li, V, Fe, Al, Ga, Si, Ge, and P.

The nonmetal element X is, for example, at least one element selected from nitrogen, chalcogen, and halogen. More specifically, the nonmetal element X is at least one element selected, for example, from N, O, F, and Cl.

First phosphor 41 is, for example, a $Ce^{3+}$-activated phosphor. With such a feature, first phosphor 41 becomes an ultrashort afterglow phosphor, and it is therefore possible to provide a light-emitting device that experiences a small amount of efficiency saturation when first phosphor 41 is excited with high-density light.

Radiation source 2 may radiate, as secondary light 6, light having a spectrum indicating a maximum peak intensity in the wavelength range of, for example, at least 480 nm and at most 600 nm. With such a feature, first phosphor 41 emits secondary light 6 having high luminous efficacy in a visible light range. Therefore, by using secondary light 6 as part of output light 31, it is possible to provide light-emitting device 21 that emits high-luminous-flux output light 31.

A $Ce^{3+}$-activated phosphor having a garnet structure is, for example, any of the following phosphors.

A cyan $Ce^{3+}$-activated phosphor having a garnet structure is, for example, $Ca_2YZ_{r2}(AlO_4)_3:Ce^{3+}$. Here, the cyan $Ce^{3+}$-activated phosphor is a $Ce^{3+}$-activated phosphor that emits light having an emission peak in the wavelength range of at least 480 nm and less than 500 nm.

A green $Ce^{3+}$-activated phosphor having a garnet structure is, for example, $Lu_3Al_2(AlO_4)_3:Ce^{3+}$, $Lu_3(Al, Ga)_2(AlO_4):Ce^{3+}$, $(Y, Lu)_3Al_2(AlO_4)_3:Ce^{3+}$, $Y_3Al_2(AlO_4)_3:Ce^{3+}$, $Y_3Ga_2(AlO_4)_3:Ce^{3+}$, or $Ca_3Sc_2(SiO_4)_3:Ce^{3+}$. Here, the green $Ce^{3+}$-activated phosphor is a $Ce^{3+}$-activated phosphor that emits light having an emission peak in the wavelength range of at least 500 nm and less than 560 nm and, in particular, at least 510 nm and less than 550 nm.

Out of the green $Ce^{3+}$-activated phosphors described above, $Lu_3Al_2(AlO_4):Ce^{3+}$ and $Lu_3(Al, Ga)(AlO_4)_3:Ce^{3+}$ each have a small degree of temperature quenching as compared with $Y_3Ga_2(AlO_4)_3:Ce^{3+}$, and therefore hold a high efficiency level even when the temperature of phosphors increases due to the primary light being excited with high-density light. Accordingly, with the use of $Lu_3Al_2(AlO_4)_3:Ce^{3+}$-activated green phosphor, it is possible to easily achieve a light-emitting device having increased efficiency in the output of green light components. $Lu_3Al_2(AlO_4)_3:Ce^{3+}$ is therefore useful as a phosphor intended for illumination.

A yellowish-green-to-yellow-to-orange $Ce^{3+}$-activated phosphor having a garnet structure is, for example, $(Y, Gd)_3Al_2(AlO_4)_3:Ce^{3+}$. Here, the yellowish-green-to-yellow-to-orange $Ce^{3+}$-activated phosphor is a $Ce^{3+}$-activated phosphor that emits light having an emission peak in the wavelength range of at least 560 nm and less than 600 nm.

An oxide phosphor such as oxide or oxide halogen that is activated by at least one ion selected from among $Eu^{2+}$, $Ce^{3+}$, and $Mn^{2+}$, or a nitride phosphor such as nitride and oxynitride can be used as a blue phosphor. More specifically, $BaMgAl_{10}O_{17}:Eu^{2+}$, $BaMgAl_{10}O_{17}:Eu^{2+}$, $Mn^{2+}$, $CaMgSi_2O_6:Eu^{2+}$, $Ba_3MgSi_2O_8:Eu^{2+}$, $Sr_4Al_{14}O_{25}:Eu^{2+}$, $Sr_4Si_3O_8Cl_4:Eu^{2+}$, $Sr_4Al_{14}O_{24}:Eu^{2+}$, $BaAl_8O_{13}:Eu^{2+}$, $Na_3Sc_2(PO_4):Eu^{2+}$, and $Sr_{10}(PO_4)_6Cl_2:Eu^{2+}$ are raised as the examples of oxide phosphor whereas $AlN:Eu^{2+}$, $YSiO_2N:Ce^{3+}$ and $SrSi_9Al_{19}ON_{31}:Eu^{2+}$ are raised as the examples of nitride phosphor.

First phosphor 41 may be, for example, a single crystal phosphor. A single crystal is a particle or a structure such that a direction of a crystal axis does not change depending on the position of a crystal. With such a structure, first phosphor 41 has less internal defects, and it is therefore possible to provide light-emitting device 21 with which less loss is caused due to first phosphor 41 in wavelength conversion.

The methods for growing first phosphor 41 include, for example, solid phase methods, liquid phase methods, and vapor phase methods. The liquid phase methods include, for example, melt growth techniques such as a Czochralski method, a simple solidification method, a Bridgman method, a Verneuil method, and a floating zone method, and also include solution methods such as a flux method, an aqueous solution method, and a hydrothermal method.

First phosphor 41 may be a piece obtained by cutting a grown single crystal into arbitrary-shaped pieces. With such a structure, it is possible to provide light-emitting device 21 capable of easy control over an area of emission face 43 of output light 31 and the emitting direction of output light 31.

Moreover, the specific crystal face of first phosphor 41 may have irregularities. With such a feature, it is less probable that total reflection occurs inside a crystal when excitation light is incident on first phosphor 41, and therefore, it is possible to provide high-power light-emitting device 21 having high efficiency in the wavelength conversion performed by first phosphor 41.

[Reflector]

Reflector 7 is disposed in such a manner to cover at least one face other than incidence face 42 and emission face 43, of light, of first wavelength converter 4. The directions of least part of 1-1 light 3, 1-2 light 5, and secondary light 6 that propagate inside first wavelength converter 4 are controlled by reflector 7. With such a feature, less optical components that are emitted or absorbed through a face other than emission face 43 of first wavelength converter 4. It is therefore possible to provide light-emitting device 21 having high efficiency in the extraction of output light 31.

Reflector 7 is made, for example, of metal such as aluminum, a white inorganic compound such as barium sulfate, or a white resin such as polyester.

[1-1 Light, 1-2 Light, Secondary Light, and Output Light]

1-1 light 3 is laser light radiated from radiation source 2, and has the optical-axis direction in an x-axis direction.

1-1 light 3 is incident on incidence face 42, for example, in a direction approximately vertical to incidence face 42 of first wavelength converter 4. In Embodiment 1, first wavelength converter 4 has a flat plate shape, and a direction that is approximately vertical to incidence face 42 of first wavelength converter 4 approximately corresponds to a direction that is approximately vertical to the thickness direction of first wavelength converter 4. With such a feature, the area of emission face 43 of first wavelength converter 4 gets larger with respect to the incidence area of first wavelength converter 4, therefore, it is possible to provide light-emitting device 21 having a large light emitting area.

Moreover, 1-1 light 3 may be incident on incidence face 42, for example, in a direction approximately vertical to the thickness direction of first wavelength converter 4, and output light 31 may emit through emission face 43, for example, in a direction approximately parallel to the thickness direction of first wavelength converter 4. With such a feature, the area of emission face 43 of first wavelength converter 4 gets larger with respect to the incidence area, therefore, it is possible to provide light-emitting device 21 having a large light emitting area.

1-2 light 5 is a component obtained by scattering at least part of 1-1 light 3 by first wavelength converter 4, and also emits 1-2 light 5 that propagates in a direction different from the x-axis direction. The wavelength component of 1-2 light 5 is substantially identical to the wavelength component of 1-1 light 3.

Secondary light 6 is a component obtained by converting the wavelength of at least part of 1-1 light 3 and 1-2 light 5 by first wavelength converter 4.

Output light 31 includes 1-2 light 5 and secondary light 6.

The correlated color temperature of output light 31 is, for example, at least 2000 K and at most 20000 K or at least 2500 K and at most 7000 K. By thus defining the range of the correlated color temperature of output light 31 of light-emitting device 21, the color of output light 31 becomes whitish, and it is therefore possible to achieve light-emitting device 21 that has a high utility value. Further, with the correlated color temperature of output light 31 of light-emitting device 21 in the range of at least 2500 K and at most 7000 K, it is possible to achieve light-emitting device 21 that emits light desirable as illumination light. Any of the following methods can be used to define the correlated color temperature of output light 31 of light-emitting device 21 to be in the range of at least 2000 K and at most 20000 K: a method of selecting the laser light source to be used as radiation source 2; a method of selecting the type of first phosphor 41 included in first wavelength converter 4; and a method of adjusting the amount of first phosphors 41 included in first wavelength converter 4.

Output light 31 can be used as illumination light.

[Cover and Light Exit Window]

According to Embodiment 1, light-emitting device 21 has a structure including a closed space enclosed by cover 8 and light exit window 81. Cover 8 has a connection portion to be connected with external power source 1, and is formed, for example, by way of injection molding using a resin material such as an ABS resin. Light exit window 81 is provided at a portion facing emission face 43 and is formed by a transparent material such as resin or glass. The closed space enclosed by cover 8 and light exit window 81 may be a vacuum space or may be filled with air, nitrogen, rare gas, or a transparent material such as resin or glass. Note that in the case where the closed space enclosed by cover 8 and light exit window 81 is a vacuum space or is filled with nitrogen, rear gas, etc., cover 8 and light exit window 81 has, for example, a highly hermetically sealed structure. In the case where the closed space enclosed by cover 8 and light exit window 81 is filled with air or a transparent material, the closed space may be conducted to the exterior.

Embodiment 2

The configuration of light-emitting device 21a according to Embodiment 2 will be described with reference to FIG. 2.

Light-emitting device 21a according to Embodiment 2 is different from light-emitting device 21 according to Embodiment 1 in the components such as second wavelength converter 9, second phosphors 91, tertiary light 10, and output light 31a. The components other than these listed are identical to those included in light-emitting device 21 according to Embodiment 1, therefore, the descriptions of the identical components are omitted.

Figure 2:
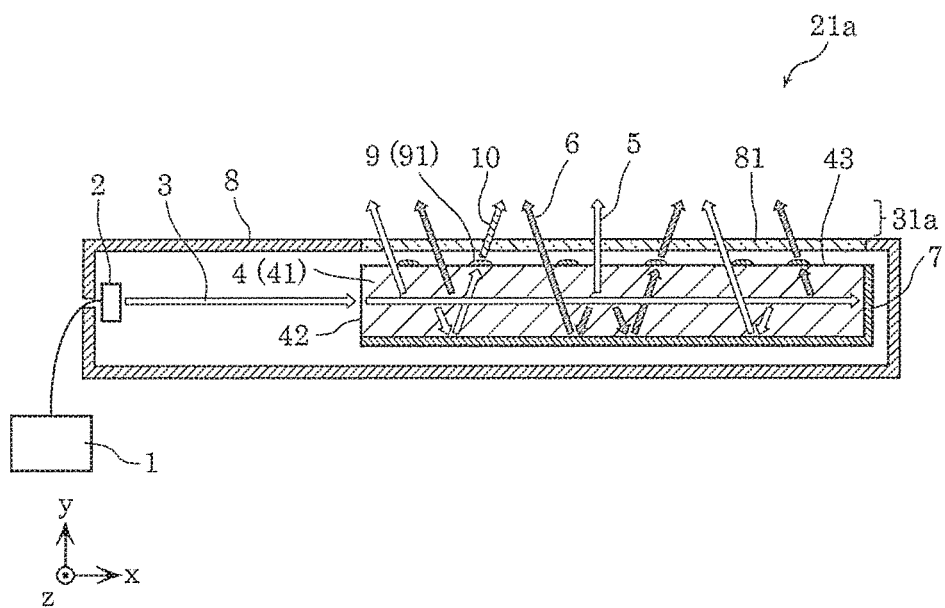
FIG. 2 is a schematic view of a light-emitting device according to Embodiment 2.

The following describes in detail, with reference to FIG. 2, the detailed configuration of light-emitting device 21a.

[Second Wavelength Converter]

In Embodiment 2, second wavelength converter 9 is located on emission face 43 of first wavelength converter 4, and is configured to absorb at least part of 1-2 light 5 and secondary light 6.

Second wavelength converter 9 includes at least second phosphors 91, absorbs at least part of 1-2 light 5 and secondary light 6 and converts into tertiary light 10.

In Embodiment 2, second wavelength converter 9 is at least one particle and the particle has a central particle diameter of at least 0.1 μm and at most 1 mm. The shape of second wavelength converter 9 can be selected from among a spherical shape, a hemispherical shape, an acicular shape, etc. Alternatively, second wavelength converter 9 may be a film-shaped (filmy) wavelength converter.

[Second Phosphor]

Second phosphors 91 are each included in second wavelength converter 9, absorbs at least part of 1-2 light 5 and secondary light 6, as excitation light, and emits tertiary light 10 in the form of fluorescence. In Embodiment 2, second wavelength converter 9 includes only second phosphors 91.

Second phosphor 91 may be a phosphor that is activated, for example, by a transition metal ion or a rare earth ion. Note that the transition metal ion may be at least one ion selected, for example, from $Ti^{4+}$, $Cr^{3+}$, $Mn^{2+}$, $Mn^{4+}$, and $Fe^{3+}$, among which $Mn^{4+}$ is a representative example thereof. The rare earth ion may be at least one ion selected, for example, from $Ce^{3+}$, $Pr^{3+}$, $Nd^{3+}$, $Sm^{3+}$, $Eu^{2+}$, $Eu^{3+}$, $Tb^{3+}$, $Dy^{3+}$, $Ho^{3+}$, $Er^{3+}$, $Tm^{3+}$, and $Yb^{3+}$. Note that a phosphor activated by $Mn^4$ may be, for example, an oxide phosphor such as $3.5MgO.0.5MgF_2.GeO_2:Mn^{4+}$ or a fluoride phosphor such as $K_2SiF_6:Mn^{4+}$. With such a feature, second phosphor 91 is able to absorb at least part of 1-2 light 5 and secondary light 6, and emit tertiary light 10 in the form of fluorescence.

Second phosphor 91 emits, as tertiary light 10, light having a spectrum indicating a maximum peak intensity in the wavelength range of, for example, at least 480 nm and at most 660 nm. With such a feature, tertiary light 10 has a large amount of visible light components having a long wavelength. Therefore, by using tertiary light 10 as part of output light 31a, it is possible to provide light-emitting device 21a desirably intended for illumination having high color rendering properties.

The spectrum of the light emitted by second phosphor 91 may be different from the spectrum of the light emitted by first phosphor 41. With such a feature, the wavelength component of light that cannot be achieved exclusively by first phosphor 41 can be used as part of output light 31a. It is thus possible to provide light-emitting device 21a capable of easy control over the spectrum of output light 31a.

Furthermore, the principal component of the spectrum of the light emitted by second phosphor 91 may contain more long-wavelength components than the principal component of the spectrum of the light emitted by first phosphor 41. With this feature, tertiary light 10 has a large amount of visible light components having a long wavelength, and it is therefore possible to provide light-emitting device 21a that emits output light 31a having high color rendering properties.

The spectrum of the light emitted by second phosphor 91 may be identical to the spectrum of the light emitted by first phosphor 41. With such a feature, it is possible, without changing the spectrum of output light 31a, to provide light-emitting device 21a having high light extraction efficiency.

Further, second phosphor 91 may be, for example, a $Ce^{3+}$-activated phosphor. With such a feature, tertiary light 10 emitted by second phosphor 91 becomes an ultrashort afterglow phosphor. It is therefore possible to provide a light-emitting device that experiences a small amount of efficiency saturation when second phosphor 91 is excited with high-density light.

What is more, second phosphor 91 may be one of a nitride phosphor or an oxynitride phosphor that emits reddish light having a spectrum indicating a maximum peak intensity in the wavelength range of at least 600 nm and at most 660 nm. The nitride phosphor may be, for example, $Sr_2Si_5N:Eu^{2+}$, (Ca, Sr) $AlSiN_3:Eu^{2+}$, $SrAlSi_4N_7:Eu^{2+}$, and $SrLiAl_3N_4$:$Eu^{2+}$. The oxynitride phosphor is, for example, $Sr_2(Si, Al)_5(N, O)_8:Eu^{2+}$, $CaAl(Si, Al)(N, O)_3:Eu^{2+}$, and $SrAl(Si, Al)_4(N, O)_7:Eu^{2+}$. With such a feature, second phosphor 91 is chemically stable, has high excitation light absorptance, and becomes capable of efficiently performing wavelength conversion of absorbed excitation light into light having a longer wavelength than the absorbed excitation light. With such a feature, second phosphor 91 comes to emit a reddish light component, and it is therefore possible to provide light-emitting device 21a capable of emitting output light 31a having high color rendering properties.

Second phosphor 91 may be, for example, a compound having a crystal structure identical to that of $CaAlSiN_3$. With such a feature, second phosphors 91 are each a phosphor having been practically proved as a phosphor for LED illumination. Therefore, by using a readily procurable second phosphor 91, it is possible to provide light-emitting device 21a that emits high-power and highly reliable output light 31a.

[Tertiary Light and Output Light]

Tertiary light 10 is a component obtained by converting the wavelength of at least part of 1-2 light 5 and secondary light 6 by second wavelength converter 9.

Output light 31a includes 1-2 light 5, secondary light 6, and tertiary light 10.

Average color rendering index Ra of output light 31a may be at least 80 and at most 100. When average color rendering index Ra of output light 31a of light-emitting device 21a is in this range, it is possible to achieve light-emitting device 21a that emits light desirable as illumination light. Any of the following methods can be used to define the range of average color rendering index Ra of output light 31a of light-emitting device 21a to be within the above-described range: a method of selecting the laser light source to be used as radiation source 2; a method of selecting the type of first phosphor 41 included in first wavelength converter 4; and a method of selecting the type of second phosphor 91 included in second phosphor 9.

Variation 1

Figure 3:
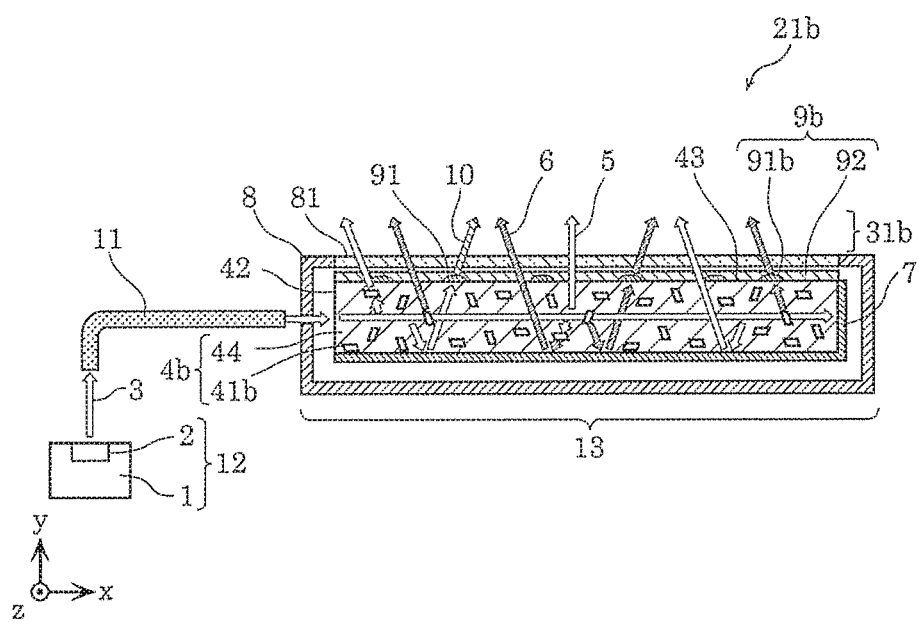
FIG. 3 is a schematic view of a light-emitting device according to Variation 1 of Embodiment 2.

Next, the configuration of light-emitting device 21b according to Variation 1 will be described with reference to FIG. 3. Note that the following describes components characterizing light-emitting device 21b, focusing on differences between light-emitting device 21b and light-emitting device 21a according to aforementioned Embodiment 2. As for the other components, they are identical to those included in light-emitting device 21a.

More specifically, external power source 1 and radiation source 2 are included in light source unit 12, and 1-1 light 3 emitted by radiation source 2 of light source unit 12 is radiated on first wavelength converter 4b via optical waveguide 11. Furthermore, first phosphors 41b are sealed by first sealant 44 and second phosphors 91b are sealed by second sealant 92.

[Optical Waveguide]

In the present variation, one end of optical waveguide 11 is optically connected to light source unit 12, the other end is optically connected to light-emitting unit 13, and optical waveguide 11 guides 1-1 light 3 emitted from light source unit 12 to the vicinity of first wavelength converter 4b. Note that optical waveguide 11 may be, for example, an optical fiber, or a sheet-shaped or plate-shaped optical waveguide.

[Sealing Structure]

First wavelength converter 4b is formed by sealing first phosphors 41b by first sealant 44, and second wavelength converter 9b is formed by sealing second phosphors 91b by second sealant 92. Second wavelength converter 9b is disposed on emission face 43 of first wavelength converter 4b.

At least one of first sealant 44 or second sealant 92 may be a resin material. The examples of the resin material include a silicone resin, a fluororesin, a silicone-epoxy hybrid resin, and a urea resin. With such a feature, an orthodox resin sealing technology which has been practically qualified is utilized for first wavelength converter 4b and second wavelength converter 9b. Therefore, it is possible to achieve light-emitting device 21b that can be easily designed.

At least one of first sealant 44 or second sealant 92 may be an inorganic material. Inorganic materials are materials other than organic materials and include a ceramic material and a metallic material. Note that the inorganic materials also include an organic siloxane in which part of siloxane is replaced with an organic functional group such as an alkyl group. More specifically, the inorganic materials are, for example, a metal oxide, low-melting glass, and ultrafine particles. A wavelength converter, having a structure such that phosphors are sealed by an inorganic material, has higher heat dissipation capability than a conventional wavelength converter that includes an organic material such as a sealing resin. The wavelength converter with such a structure is therefore able to suppress an increase in the temperature of the phosphors which is triggered by the excitation of the phosphors, for example. As a result, the temperature quenching of the phosphors is suppressed, and light-emitting device 21b is thereby capable of outputting high-power output light 31b.

[Light-Emitting Unit]

Light-emitting unit 13 includes first wavelength converter 4b, second wavelength converter 9b, reflector 7, cover 8, and light exit window 81. In light-emitting unit 13, first wavelength converter 4b and second wavelength converter 9b are disposed in a closed space enclosed by cover 8 and light exit window 81. Light-emitting unit 13 may have a diffuser plate or a support substrate.

Light-emitting unit 13 may be, for example, a lighting device such as a light source or a lighting system, or a display device such as a projector.

[Others]

The above has described the embodiments and variation of the light-emitting device according to one aspect of the present invention. The present invention, however, is not limited to the aforementioned embodiments and variation.

For example, first wavelength converter 4 has a flat plate shape in the aforementioned embodiments and variation, but the shape of first wavelength converter 4 is not limited to such. First wavelength converter 4 may be, for example, approximately cubic or hemispherical in shape. Furthermore, first wavelength converter 4 may be composed of one single crystal phosphor having a garnet crystal structure, and may be in the form of a single particle having at least one facet. Note that "facet" is a flat crystal face viewed in an atomic scale.

In the aforementioned embodiments and variation, first wavelength converter 4 may not necessarily include reflector 7.

In the aforementioned embodiments and variation, second wavelength converter 9 may not necessarily be disposed on emission face 43. Second wavelength converter 9 may be provided, for example, inside first wavelength converter 4.

In the aforementioned embodiments and variation, a semiconductor laser is used as an example of radiation source 2, but radiation source 2 is not limited to a semiconductor laser. For example, a solid-state laser such as a YAG laser, a liquid laser such as a dye laser, a gas laser such as an Ar-ion laser, a He—Cd laser, a nitrogen laser, or an excimer laser can be used as radiation source 2. Further, in the aforementioned embodiments and variation, radiation source 2 is described as singular in number, but may be plural.

Forms obtained by various modifications to each of the exemplary embodiments and the variation that can be conceived by a person skilled in the art as well as forms realized by arbitrarily combining structural components and functions in the exemplary embodiment which are within the scope of the essence of the present invention are included in the present invention.

The invention claimed is:

1. A light-emitting device that emits output light, the light-emitting device comprising:
   a radiation source that radiates laser light as first primary light;
   a first wavelength converter; and
   a second wavelength converter that includes a second phosphor,
   wherein
   the first wavelength converter includes at least a first phosphor,
   the first wavelength converter scatters at least part of the first primary light and converts into second primary light that propagates in a direction different from an optical-axis direction of the first primary light,
   the first phosphor included in the first wavelength converter absorbs at least part of the first primary light and the second primary light and converts into secondary light that has more long-wavelength components than a wavelength component of at least one of the first primary light or the second primary light,
   the output light includes the second primary light and the secondary light,
   the first wavelength converter has an incidence face on which the first primary light is incident and an emission face through which the output light emits, and a normal to the incidence face and a normal to the emission face are mutually different,
   the first phosphor is a single crystal phosphor,
   the second phosphor included in the second wavelength converter absorbs at least part of the second primary light and the secondary light, and emits tertiary light, and
   the output light includes the tertiary light.

2. The light-emitting device according to claim 1, wherein the first phosphor has a garnet crystal structure.

3. The light-emitting device according to claim 2, wherein the radiation source emits bluish light as the first primary light, and
the first phosphor is a $Ce^{3+}$-activated phosphor.

4. The light-emitting device according to claim 1, wherein the first phosphor emits, as the secondary light, light having a spectrum indicating a maximum peak intensity in a wavelength range of at least 480 nm and at most 600 nm.

5. The light-emitting device according to claim 1, wherein the second phosphor emits, as the tertiary light, light having a spectrum indicating a maximum peak intensity in a wavelength range of at least 480 nm and at most 660 nm.

6. The light-emitting device according to claim 1, wherein the spectrum of the light emitted by the second phosphor is different from the spectrum of the light emitted by the first phosphor.

7. The light-emitting device according to claim 1, wherein a principal component of the spectrum of the light emitted by the second phosphor contains more long-wavelength components than a principal component of the spectrum of the light emitted by the first phosphor.

8. The light-emitting device according to claim 1, wherein the spectrum of the light emitted by the first phosphor is identical to the spectrum of the light emitted by the second phosphor.

9. The light-emitting device according to claim 1, wherein the second phosphor is a $Ce^{3+}$-activated phosphor.

10. The light-emitting device according to claim 1, wherein the second phosphor is either a nitride phosphor or an oxynitride phosphor that emits reddish light having a spectrum indicating a maximum peak intensity in a wavelength range of at least 600 nm and at most 660 nm.

11. The light-emitting device according to claim 10, wherein the second phosphor is a compound having a crystal structure identical to a crystal structure of $CaAlSiN_3$.

12. The light-emitting device according to claim 1, wherein the first wavelength converter has a structure in which the first phosphor is sealed by at least one of a light transmissive resin material or a light transmissive inorganic material.

13. The light-emitting device according to claim 1, wherein the second wavelength converter has a structure in which the second phosphor is sealed by at least one of a light transmissive resin material or a light transmissive inorganic material.

14. The light-emitting device according to claim 1, wherein a correlated color temperature of the output light is at least 2000 K and at most 20000 K.

15. The light-emitting device according to claim 1, wherein average color rendering index Ra of the output light is at least 80 and at most 100.

16. The light-emitting device according to claim 1, wherein
    the first wavelength converter includes a reflector on at least one face other than the emission face, and
    directions in which at least part of the first primary light, the second primary light, and the secondary light propagate inside the first wavelength converter are controlled by the reflector.

17. The light-emitting device according to claim 1, wherein the first primary light is incident on the incidence face in a direction approximately vertical to the incidence face of the first wavelength converter.

18. The light-emitting device according to claim 1, wherein the first wavelength converter has a flat plate shape.

19. The light-emitting device according to claim 18, wherein
    the first primary light is incident on the incidence face in a direction approximately vertical to a thickness direction of the first wavelength converter, and the output light emits through the emission face in a direction approximately parallel to the thickness direction of the first wavelength converter.

20. The light-emitting device according to claim 1, wherein the first primary light emitted from the radiation source is radiated on the first wavelength converter via an optical waveguide.

* * * * *